INTEGRATED WIDE-BAND AMPLIFIER SYSTEM USING NEGATIVE FEEDBACK MEANS INCLUDING A THERMALLY-COUPLED LOW-PASS THERMAL FILTER

Filed July 13, 1964
4 Sheets-Sheet 1

INVENTORS.
Jerry D. Merryman
Stephen P. Emmons
Walter T. Matzen
E. Mickey Hubbard, Atty INVENTORS.
Jerry D. Merryman
Stephen P. Emmons
Walter T. Matzen
E. Mickey Hubbard Atty INVENTORS.
Jerry D. Merryman
Stephen P. Emmons
Walter T. Matzen
E. Mickey Hubbard, Atty INVENTORS.
Jerry D. Merryman
Stephen P. Emmons
Walter T. Matzen
E. Mickey Hubbard, Atty United States Patent Office 3,341,785
Patented Sept. 12, 1967

3,341,785

INTEGRATED WIDE-BAND AMPLIFIER SYSTEM USING NEGATIVE FEEDBACK MEANS INCLUDING A THERMALLY-COUPLED LOW-PASS THERMAL FILTER

Jerry D. Merryman, Dallas, and Stephen P. Emmons and Walter T. Matzen, Richardson, Tex., assignors to Texas Instruments Incorporated, Dallas, Tex., a corporation of Delaware Filed July 13, 1964, Ser. No. 381,998
27 Claims. (Cl. 330—28)

ABSTRACT OF THE DISCLOSURE

Disclosed is a wideband amplifier including a negative feedback circuit having a thermally-coupled low pass thermal filter to suppress any A.C. component in the input to the amplifier, the amplifier being particularly suited to being fabricated in integrated circuit form.

The present invention relates to wide-band amplifiers and more particularly, but not by way of limitation, to a video amplifier system particularly suited for fabrication as an integrated microcircuit, and to a low-pass thermal filter which employs no capacitors.

In most wide-band amplifiers heretofore utilized, successive amplifier stages are coupled by capacitors and are therefore commonly referred to as A.C. amplifiers. The low-frequency roll-off of an A.C. amplifier is dependent primarily upon the size of the capacitors used to couple successive amplifier stages. In integrated circuits wherein a plurality of active components is formed by diffusion techniques in a monocrystalline semiconductor chip, capacitors are fabricated from a large area transistor by shorting the collector and emitter. Using this technique, it is virtually impossible to fabricate capacitors having a sufficient size to produce a wide-band A.C. amplifier. A further difficulty is that such a diffused capacitor produces a stray capacitance between the collector region and the substrate which may be as high as 25% the capacitance of the capacitor itself. This materially affects the high-frequency performance of an A.C. amplifier using the capacitor for coupling. Better low-frequency response can be achieved by using field effect amplifiers as compared with transistor amplifiers, but at the expense of reduced band width.

When a low-frequency amplification is required in an integrated semiconductor network, it is customary to directly couple successive amplifier stages. However, a direct-coupled or D.C. amplifier has the disadvantage that a D.C. component will be produced in the amplifier output as a result of either a D.C. input component or as a result of drift caused by thermal or time effects of the transistors. On the other hand, a direct-coupled amplifier has the advantage that the high-frequency performance is dependent only upon the response of the direct-coupled stages and is therefore limited only by the technology of fabricating high-frequency semiconductor devices in such a manner as to reduce the stray capacitance.

The present invention concerns an amplifier system which employs no capacitors. The novel amplifier system uses only direct-coupled amplifier stages and a negative feedback circuit with a low-pass thermal filter to suppress the D.C. output of the system and thereby increase the D.C. stability of the system. In accordance with one aspect of the invention, the wide-band amplifier system is comprised of an amplifier circuit means having an input and an output and a feedback circuit means, including a low-pass thermal filter, having a negative low-pass transfer function connecting the output of the amplifier circuit means to the input.

In accordance with a more specific aspect of the invention, the feedback circuit means comprises a thermally-conductive member having a thermal capacitance, means thermally insulating the member from an ambient heat sink, heating means for heating the thermally-conductive member in proportion to the D.C. output of the amplifier, and heat-sensing means for sensing the temperature of the thermally-conductive member and for varying the D.C. input to the amplifier in proportion to the sensed temperature.

In accordance with another important aspect of the invention, the wide-band amplifier system comprises a differential amplifier having direct-coupled amplifier stages, first and second inputs and corresponding first and second outputs, and feedback circuit means having a pair of low-pass thermal filter devices connecting the first output to one of the inputs and the second output to the other of the inputs to produce negative feedback in push-pull relationship.

In accordance with a still more specific aspect of the invention, the low-pass thermal filter comprises a single crystal substrate of semiconductor material which has a thermal capacity. A heater circuit and a temperature-sensing circuit are formed in the substrate by diffusion techniques. The substrate is thermally insulated from an ambient heat sink so as to provide an effective thermal resistance between the substrate and the ambient heat sink. Thus, the combination of the thermal resistance and thermal capacitance produces a thermal transfer responsive only to D.C. and low-frequency change in temperature. More specifically, the heating circuit means may comprise an emitter-follower transistor connected to drive a resistor in response to the output from the amplifier. The sensing circuit may comprise one or more diodes but preferably comprises an emitter-follower transistor such that the input to the amplifier system may be connected to the base of the transistor and the emitter connected to the input of the amplifier through one or more diodes to increase the sensitivity of the device. As the temperature of the substrate rises, the voltage drop across the sensing elements decreases.

Therefore, it is an object of the present invention to provide a wide-band amplifier of improved performance characteristics.

Another object of the invention is to provide a wide-band amplifier which is particularly adapted to be fabricated as an integrated circuit by conventional diffusion techniques.

A further object of the invention is to provide a D.C. amplifier system using no capacitors of any consequential size and which has a relatively stable D.C. output regardless of D.C. input components or D.C. drift resulting from thermal or time effects of semiconductor components.

Another object of this invention is to provide a low-pass filter in integrated circuit form.

Another object of this invention is to provide a low-pass thermal filter device having a low frequency heretofore unattainable in integrated circuit devices.

Additional objects and advantages will be evident to those skilled in the art from the following detailed description and accompanying drawings wherein.

Figure 1:
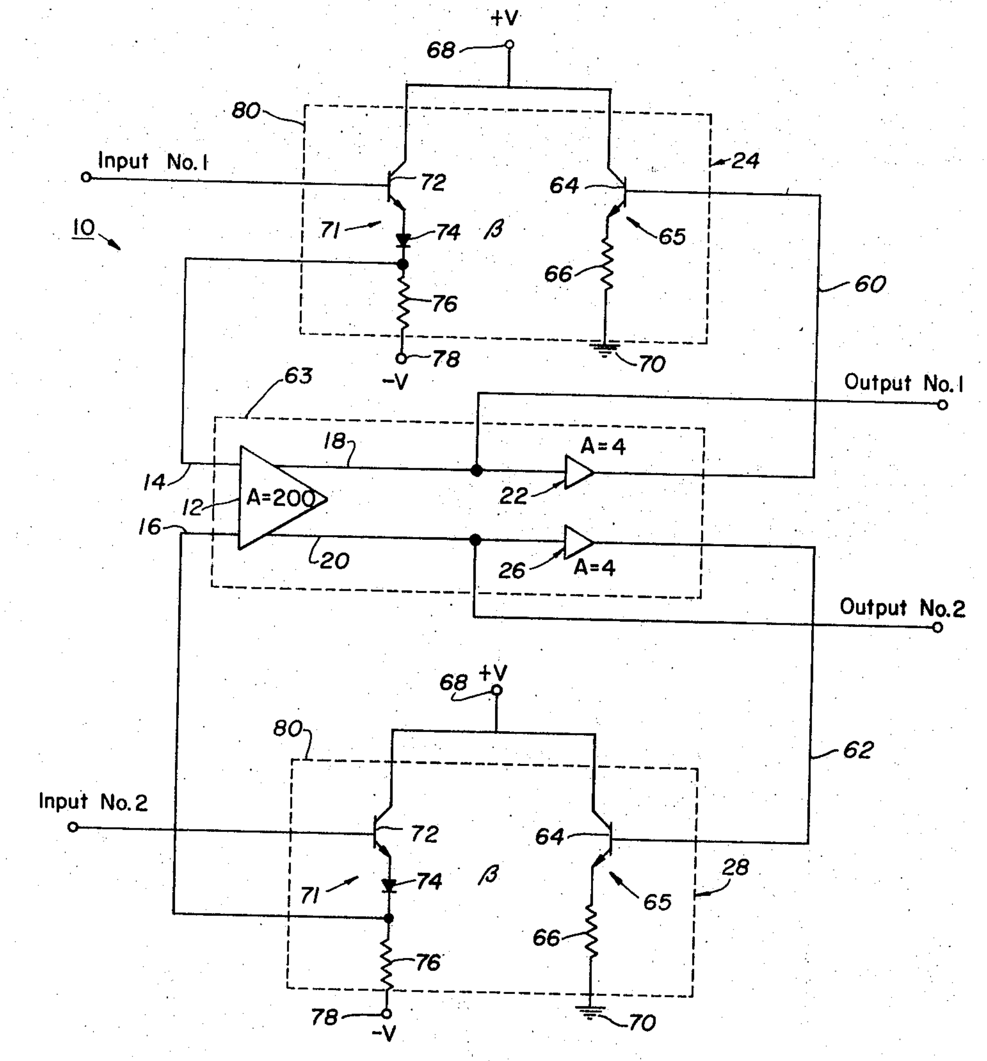
FIGURE 1 is a schematic circuit diagram of an amplifier system constructed in accordance with the present invention.

Referring now to the drawings, an amplifier system constructed in accordance with the present invention is indicated generally by the reference numeral 10 in FIGURE 1. The amplifier system 10 is of the differential type and has dual input terminals, Input No. 1 and Input No. 2, and dual output terminals, Output No. 1 and Output No. 2. A primary amplifier 12 has first and second inputs 14 and 16 and first and second outputs 18 and 20. The outputs 18 and 20 are connected to Outputs Nos. 1 and 2 of the amplifier system 10. A first negative feedback circuit connects the first output 18 to the first input 14 and is comprised of a direct-coupled phase inverter amplifier 22 and a low-pass thermal filter device 24. A second feedback circuit is comprised of a second direct-coupled phase inverter amplifier 26 and a second low-pass thermal filter device 28. Inputs Nos. 1 and 2 of the amplifier system 10 are connected to the first and second thermal filter devices 24 and 28, respectively, as will hereafter be described in greater detail.

Figure 2:
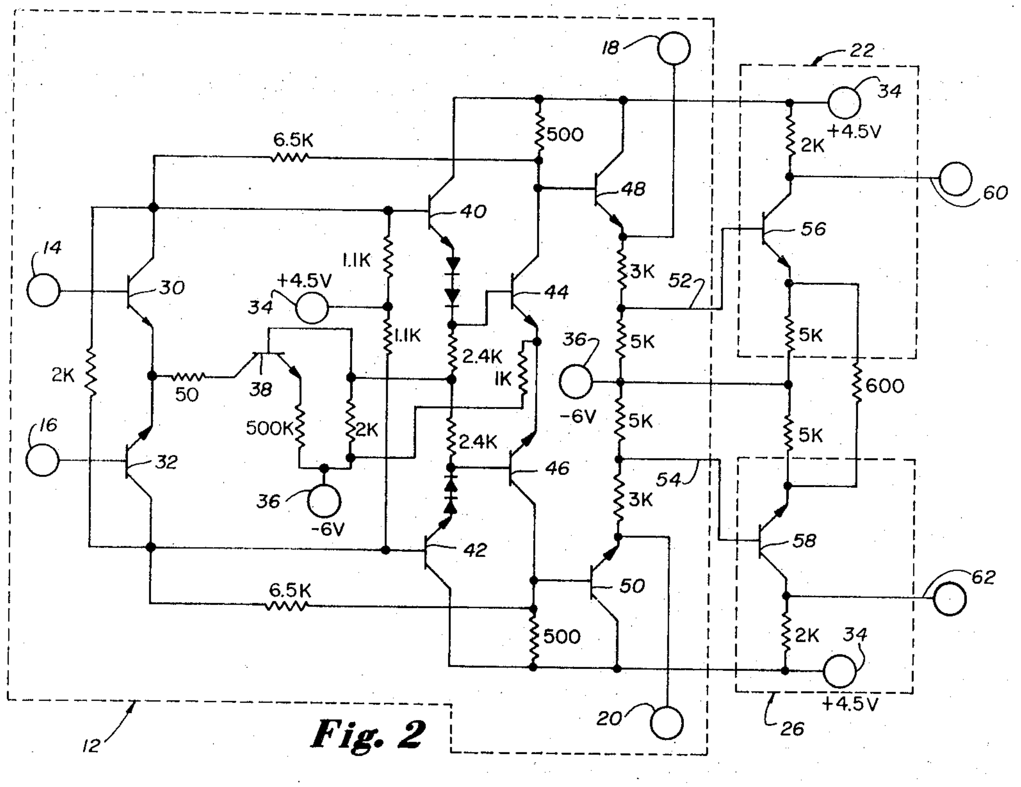
FIGURE 2 is a more detailed schematic circuit diagram of the amplifiers of the system illustrated in FIGURE 1.

In accordance with the broader aspects of the present invention, the amplifier 12 may be of any desired type. However, in accordance with a more specific aspect of the invention, the amplifier 12 is of the type illustrated in FIGURE 2, having direct-coupled, differential amplifier stages. The amplifier 12 has a first amplifier stage comprised of a pair of transistors 30 and 32 which are differentially connected in the conventional sense between a positive voltage source, indicated by the terminals 34, and a negative emitter voltage supply, as represented by the terminals 36. The emitters of the transistors 30 and 32 are connected through a transistor 38 which provides, for all practical purposes, a constant current source in the conventional manner. The collectors of the transistors 30 and 32 are connected to a first emitter-follower stage comprised of transistors 40 and 42. The emitters of the transistors 40 and 42 are connected through a number of diodes to the bases of transistors 44 and 46, which comprise a second differential amplifier stage. The collectors of the transistors 44 and 46 are connected to the bases of transistors 48 and 50 which form a second emitter-follower stage. The outputs 18 and 20 of the amplifier 12 which are also Output No. 1 and Output No. 2, respectively, of the amplifier system 10 are connected to the emitters of the transistors 48 and 50.

The outputs 18 and 20 of the amplifier 12 are also connected to the inputs of amplifiers 22 and 26, respectively, by conductors 52 and 54 which are connected to the bases of transistor 56 and 58. The collector of the transistor 56 is connected by conductor 60 to the thermal filter 24 (not shown). Similiarly, the collector of transistor 58 is connected by conductor 62 to the second thermal filter 28 (not shown). Thus, it will be noted that the amplifiers 22 and 26 have single amplifier stages so as to provide a 180° phase shift from the output of amplifier 12 which is in phase with the input to the amplifier system 10.

It will be noted that all amplifier stages of the amplifiers 12, 22 and 26 are directly coupled and that the circuit employs no capacitors. The three amplifiers are therefore particularly suited for fabrication as a micro or integrated circuit on a single semiconductor crystal and the entire circuit illustrated in FIGURE 2 including the three amplifiers would normally be formed in a monocrystalline semiconductor substrate such as silicon, represented by the dotted outline 63 in FIGURE 1, by conventional diffusion techniques as will presently be described.

The thermal filters 24 and 28 are of identical construction. Therefore, for convenience of illustration, only the thermal filter 24 will be described in detail, and corresponding parts of the thermal filter 28 will be designated by corresponding reference numerals. The thermal filter 24 is comprised of a heater circuit indicated generally by the reference numeral 65 as shown in FIGURE 1, for heating a thermal capacitance member 80 which furnishes thermal coupling between the heater circuit 65 and the temperature sensing circuit 71, as presently to be described in greater detail. The heater circuit 65 comprises a transistor 64 and a resistor 66 connected in series between a positive voltage supply 68 and ground terminal 70. The output from the amplifier 22 is connected by the conductor 60 to the base of the transistor 64 such that the current through the heating circuit 65 will be proportional to the output voltage of the amplifier. A temperature-sensing circuit for sensing the temperature of the heat capacitance member 80 is indicated generally by the reference numeral 71. The circuit 71 is comprised of a transistor 72, a diode 74, and a resistor 76, which are connected in series between the positive voltage supply 68 and the negative voltage supply 78. In general, any suitable means for sensing the temperature of the thermal capacitance member 80 and varying the input to the amplifier system may be employed. However, the transistor provides a preferred method for introducing the input voltage of the amplifier system 10 to the primary amplifier 12. Any number of diodes may be used to increase the sensitivity of the sensing circuit and the diodes may be the base-emitter junctions of transistors. Input No. 1 of the amplifier system is connected to the base of the transistor 72 and diode 74 is connected to the input 14 of the amplifier 12. Similarly, Input No. 2 is connected to the base of transistor 72 of thermal filter 28 and the diode 74 is connected to the input 16 of the primary amplifier 12.

Figure 3:
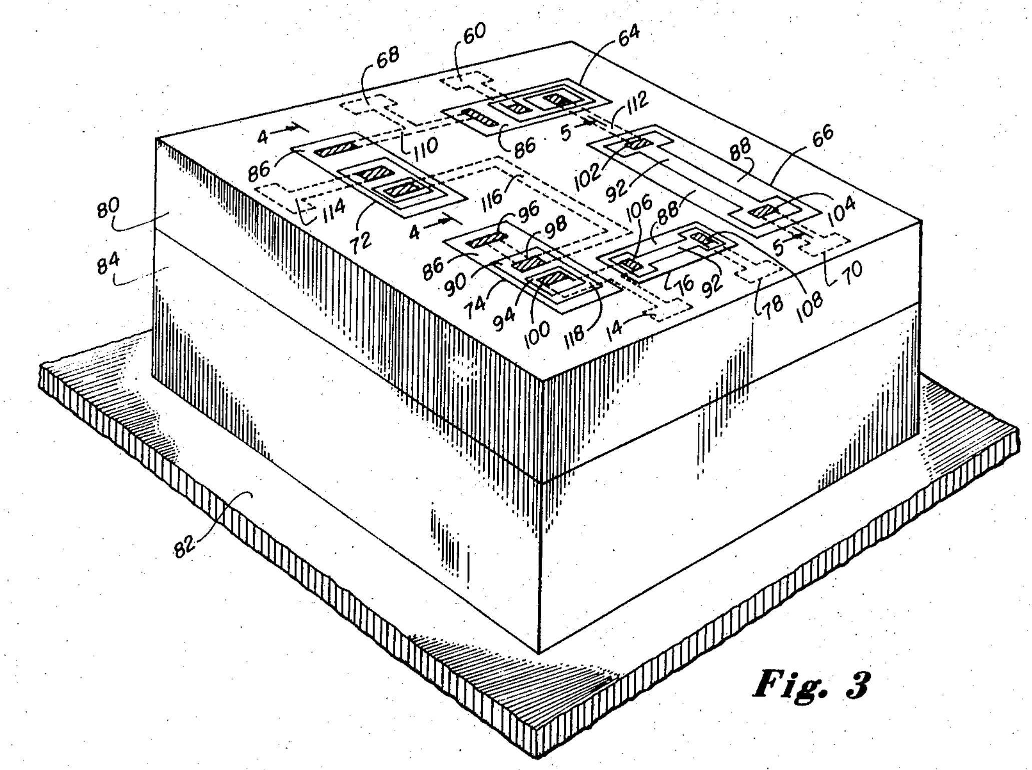
FIGURE 3 is a perspective view, somewhat schematic, of a low-pass thermal filter device constructed in accordance with the present invention and illustrated schematically in FIGURE 1.

The construction of the thermal filter device 24 is illustrated in FIGURE 3. In particular, the filter 24 is comprised of a thermal capacitance member 80 which is connected to and thermally-insulated from an ambient heat sink 82 by an insulator 84. In particular, the thermal capacitance member 80 may be a monocrystalline substrate of semiconductor material, such as silicon, in which the components of the thermal device are formed by conventional diffusion techniques, as will presently be described in greater detail. The thermal resistance of the thermal capacitance member 80 is several orders of magnitude less than the thermal resistance of the insulator 84 which may be fabricated from ceramic foam or other suitable thermal insulating material. The ambient heat sink 82 may comprise the metallic case of a conventional integrated circuit packaging device. Both of the thermal feedback filters 24 and 28 may be disposed in the same package and connected to the metallic heat sink 82 at spaced points so that the thermal capacitance members are thermally-isolated from one another.

As previously mentioned, an important aspect of the invention is that the amplifier system 10 may be fabricated entirely in integrated circuit form. All transistors, resistors and other active components may be fabricated using conventional diffusion techniques, such as will now be described for the low-pass thermal filter 10.

Figure 5:
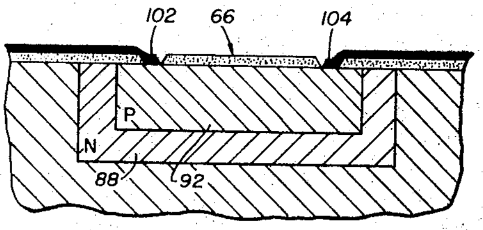
FIGURE 5 is a partial sectional view taken substantially on lines 5—5 of FIGURE 3.
Figure 4:
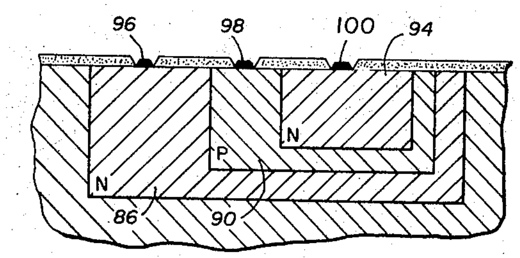
FIGURE 4 is a partial sectional view taken substantially on lines 4—4 of FIGURE 3.

The transistors 64 and 72 and the diode 74 may all be triple-diffused planar NPN transistors while the resistors 66 and 76 may be isolated diffused regions. The thermal capacitance member 80 may be P-type silicon doped with boron during crystal growth to produce a resistivity of perhaps 10 to 15 ohm-centimeters and thereby serve as the circuit substrate. An oxide coating (not shown) is formed on the top surface of the substrate and photo-resist masking techniques used to expose the selected areas of the surface defining the outlines of the N-type collector regions 86 of the three transistors and the N-type isolation regions 88 of the resistors to be formed, as can best be seen in the sectional views of FIGURES 4 and 5, respectively. An N-type diffusion is then performed by depositing phosphorus on the top surface of the substrate and heating at diffusion temperatures for a time adequate to produce a junction at the desired depth. The unremoved oxide coating acts as a mask for the phosphorus diffusion in a manner well known in the art. Another oxide coating is formed and selected areas of the coating removed by photo-resist methods to expose the outlines of the P-type transistor base regions 90 and the resistive paths 92 of the resistors. A P-type diffusion is then performed by depositing boron over the surface of the substrate and heating to diffusion temperatures for a sufficient period of time to produce a junction at the desired depth. The oxide coating is re-formed over the surface of the substrate during the diffusion and areas selectively etched by photo-resist techniques to outline the N-type emitter regions 94 of the transistors to be formed. A second N-type diffusion is then performed by depositing phosphorus on the surface of the substrate and heating to diffusion temperatures for a period of time sufficient to provide a junction at the desired depth. The last oxide coating is formed over the substrate and is then selectively etched to provide openings in the oxide for making electrical contact with the various active semiconductor regions. Aluminum or other metal is evaporated onto the surface of the substrate and processed to make ohmic contact with the exposed silicon in the contact areas. The excess aluminum is then selectively removed by etching to form interconnecting leads as illustrated by the dotted outlines in FIGURE 3. Additional electrical leads may be provided by ball-bonding wires between the appropriate contacts formed by the deposited and etched aluminum.

In particular, it will be noted that collector, base and emitter contacts 96, 98 and 100 are formed on each of the transistors, as represented by the cross-hatched areas. Contacts 102 and 104 are provided for the resistor 66 and contacts 106 and 108 are provided for the resistor 76, as represented by cross-hatched areas also. The positive voltage terminal 68 is connected by conductor 110 to the collectors of transistors 64 and 72. Conductor 60 is connected to the base of transistor 64, and the emitter of transistor 64 is connected by conductor 112 to contact 102 of resistor 66. Contact 104 is connected to the ground terminal 70. The base of the transistor 72 is connected to Input No. 1 (not shown) by terminal pad 114. The emitter of transistor 72 is connected by conductor 116 to the base contact 98 of the transistor which forms the diode 74, the collector being shorted to the base. The emitter contact 100 of the transistor 74 is connected by conductor 118 to the contact 106 of resistor 76 and to input conductor 14. The other contact 108 of resistor 76 is connected to the negative voltage supply terminal 78. Electrical connections may be made between the various terminal pads of the substrate and the terminal wires of the package part of which forms the heat sink 82 by ball-bonding lead wires therebetween.

*Operation*

In the operation of the amplifier system 10 as shown in FIGURE 1, assume first that the voltages applied to the Inputs Nos. 1 and 2 of the system are at the same level, such as ground potential. In such a case, the circuit would then be adjusted so that the power dissipated by the heating circuits of the thermal devices 24 and 28 would maintain the thermal capacitance members 80 at some temperature above that of the ambient heat sink 82. For example, the members 80 might be 25° C. above the ambient temperature.

Now assume that a D.C. voltage component is applied to Input No. 1 which is positive with respect to the D.C. voltage level of Input No. 2 The positive voltage at Input No. 1, less the base-to-emitter voltage drop across the transistor 72 and across the diode 74, will be applied to input 14 of the primary amplifier 12. Similarly, the voltage applied to Input No. 2, less the base-to-emitter drop of the transistor and across the diode of the thermal device 28, will be applied through input 16 to amplifier 12. Since the amplifier 12 has a pair of amplifier stages, the output voltage at 18 will be in phase and positive, and the output voltage at 20 will be negative with respect to the quiescent operating point. The difference between the two voltages will be equal to the difference between the input voltages at 14 and 16 of the amplifier, multiplied by the gain of the primary amplifier 12, and will thus tend to be equal to the gain times the difference in the input voltages to the system.

The positive change in voltage at the first output 18 is then inverted by the single stage amplifier 22 and increased by a gain factor in order to drive the base of the transistor 64 of the thermal device 24. The power dissipated by the heater circuit 65 of the thermal device 24 is therefore reduced and the thermal capacitance member 80 of the device 24 cools. This results in an increase in the voltage drop from base to emitter of the transistor 72 and across the diode 74 because of the negative thermal coefficient of the base-emitter junctions which reduces the magnitude of the positive voltage applied to the first input terminal 14 of the amplifier 12.

On the other hand, the negative change at the second output 20 is amplified and inverted by the single stage amplifier 26 to produce a positive voltage change at the base of the transistor 64 of the thermal device 28. The positive voltage change results in an increase in power dissipation by the heater circuit 65 so that the thermal capacitance member 80 of the thermal device 28 is heated. The increased temperature of the base-emitter junction of the transistor 72 and the junction of the diode 74 decreases the voltage drop from base to emitter so as to raise the potential applied to the second input terminal 16 of the amplifier 12. Thus, it will be noted that the combination of the phase-inverting amplifier and the thermal device results in a negative feedback in the respective loop.

As illustrated in the preferred embodiment, a phase-inverting stage is used in order to produce the negative feedback and to provide the necessary gain to drive the thermal heating circuits. However, within the broader concepts of the invention, negative feedback may be achieved in any manner. For example, the primary amplifier may have an odd number of stages to produce an output 180° out-of-phase with the input and sufficient gain to drive the thermal elements. Or the outputs of the primary amplifier may be cross-coupled by the thermal elements directly if the primary amplifier has a low common mode gain and sufficient gain to drive the thermal devices.

Figure 8:
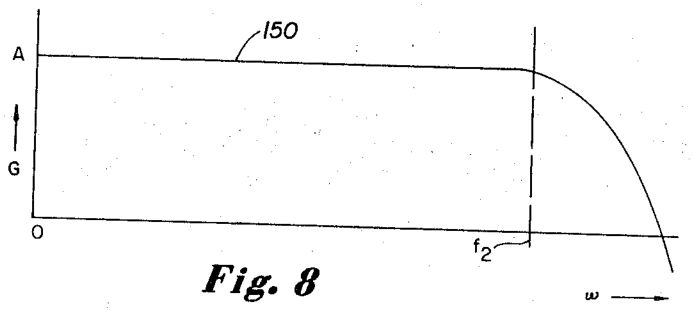
FIGURE 8 is a plot of the gain with respect to frequency transfer function of the primary amplifier of the system illustrated in FIGURE 1.

Taken by itself, the primary amplifier 12 has a transfer function as illustrated by the curve 150 of FIGURE 8, which is a plot of gain with respect to frequency. It will be noted that the gain is constant from zero frequency or D.C. to the high-frequency roll-off point represented by the dotted line $f_2$. The high-frequency roll-off point is limited only by the high frequency response of the circuit components, and therefore is limited only by the technology involved in producing diffused integrated circuits. However, any D.C. components at the input will be increased by the same high gain. Therefore, if the D.C. voltage about which the A.C. voltage swings is not highly stable, the A.C. signal may be clipped or the amplifier saturated as a result of relatively minor shifts in the D.C. input level, or as a result of D.C. drift caused by changes in the various semiconductor components as a result of temperature or aging. The differential configuration of the amplifier 12 reduces the D.C. drift problem to a minimum, but cannot totally eliminate the adverse effects unless all circuit components are perfectly matched.

Figure 6:
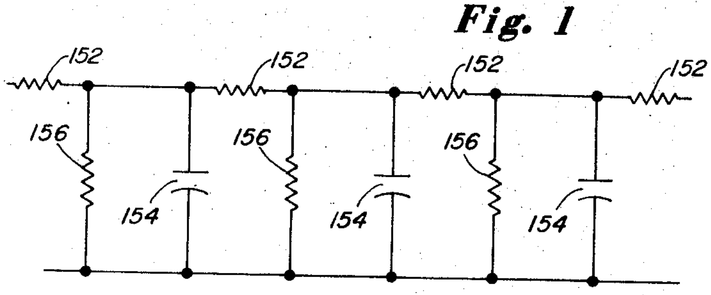
FIGURE 6 is a schematic diagram of a high-frequency equivalent circuit of the filter device illustrated in FIGURE 3.

The negative feedback loops comprised of the amplifiers 22 and 26 and the low-pass thermal filter devices 24 and 28 suppress the D.C. and low-frequency gain of the primary amplifier 12 by reason of the low-pass characteristics of the thermal filter devices 24 and 28. The thermal circuit of the thermal device 24 is comprised of the thermal capacitance member 80, the insulator 84, and the ambient heat sink 82 as shown in FIGURE 3. Since the sensing circuit is separated from the heater circuit by a finite distance, the thermal system may be represented by the equivalent electrical model shown in FIGURE 6. The thermal resistance of the member 80 is represented by the series of resistors 152, the thermal capacitance of the member 80 is represented by the capacitors 154, and the thermal resistance of the insulator 84 is represented by the resistors 156. However, the thermal device 24 is constructed so that the heater and sensor circuits are placed in close proximity and capacitance member 80 has a thermal conductivity several orders of magnitude greater than that of the insulator 84. Over the frequency range of interest, the resistance of the member 80 is insignificant. Therefore, the resistors 152 of the model of FIGURE 6 may be eliminated, and the resistance of the insulator 84 and the capacitance of the member 80 may be combined and represented by the resistor 160 and capacitor 158, respectively, in the model of FIGURE 7. In the electrical model, the voltage across the network corresponds to the temperature of the member 80 in excess of the ambient temperature, current flow through the resistor 160 corresponds to the instantaneous heat flow through the insulator 84, and total current flow into the network corresponds to the power dissipated in the heater circuit.

Figure 7:
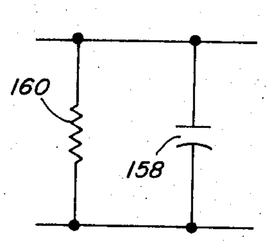
FIGURE 7 is a schematic diagram of a low-frequency equivalent circuit of the thermal device of FIGURE 3.
Figure 9:
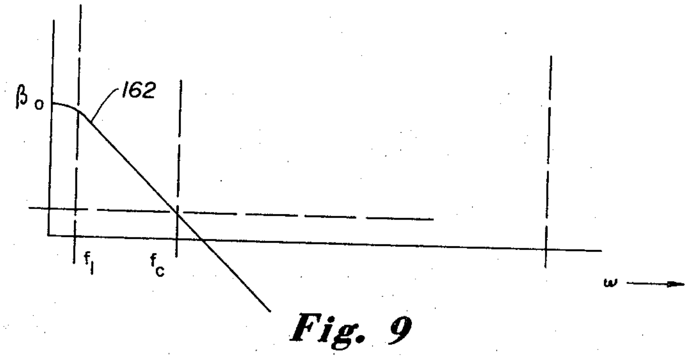
FIGURE 9 is a plot of the transfer function of the low-pass thermal feedback device constructed in accordance with the present invention.

An RC product or thermal time constant of the model of FIGURE 7 may be computed. For a silicon substrate 50 mils by 50 mils by 5 mils and an insulating structure of thin ceramic foam having a temperature rise of 1.2° C. per mw., the RC product or thermal time-constant is about 0.4 second, which corresponds to a turn-over frequency of 0.4 c.p.s. The transfer function of the thermal device 24, as amplified by amplifier 22, using such materials may be represented by the curve 162 in FIGURE 9. The curve is characterized by a roll-off at 0.4 c.p.s. followed by an ultimate slope of −6 decibels per octave at 90° phase lag from the low frequency response.

Figure 10:
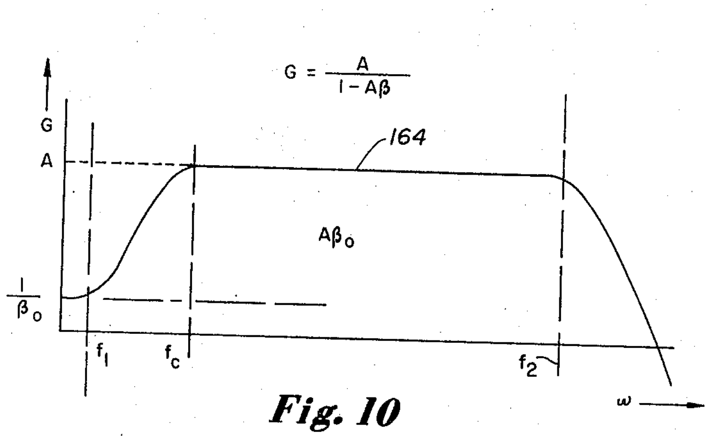
FIGURE 10 is a typical plot of the total gain of the amplifier system of the present invention with respect to frequency; and, FIGURE 11 is a plot of the voltage gain with respect to frequency of one typical embodiment of the present invention.

The combination of the amplifier 12 and the feedback loops including the inverting amplifiers 22 and 26 and the low-pass thermal filter devices 24 and 28 connected in push-pull relationship gives a performance illustrated by the curve 164 in FIGURE 10. The D.C. response of the amplifier system 10 is not entirely eliminated, but is suppressed by the factor $1-A\beta_o$, where $\beta_o$ is the feedback ratio at D.C. and A is the gain of the amplifier 12. The system's lower cut-off frequency is determined by the thermal capacitance of the member 80 and the thermal resistance of the insulator 84 and the loop gain $A\beta_o$.

Figure 11:
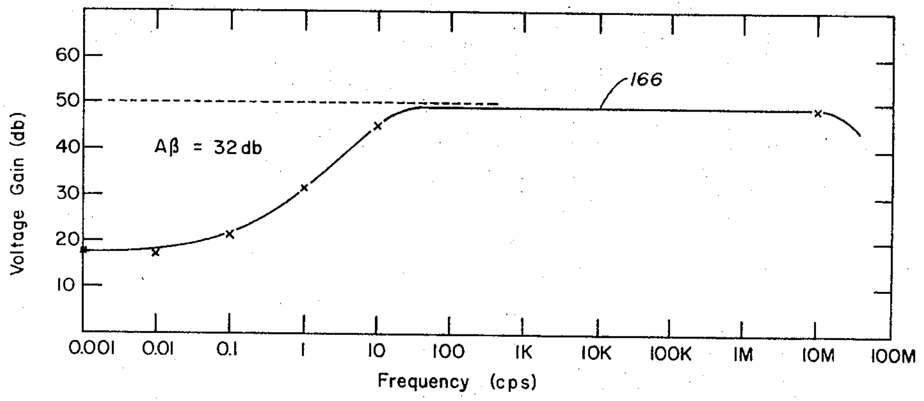

In one particular embodiment of the invention, the amplifiers 12, 22 and 26 were fabricated by diffusion techniques as an integrated circuit in a single silicon crystal and placed in a single package. The two thermal feedback elements were similarly formed on separate silicon substrates, each 50 mils by 50 mils by 5 mils, and placed in another package. Ball-bonded gold wire leads were then used to make the necessary interconnections between the contacts formed on the substrates and the terminals of the packages, and the terminals of the two packages interconnected by conventonal techniques. A system performance represented by the curve 166 in FIGURE 11 resulted. It will be noted that the low frequencies are suppressed 32 decibels and the system has a 50 decibel gain from 20 c.p.s. to 15 mc.

From the above detailed description, it will be evident that a novel and improved amplifier system has been described. The amplifier system employs no capacitors and therefore is particularly suited for fabrication as an integrated circuit by diffusion techniques on monocrystalline semiconductor substrates. Yet, the amplifier system has low-frequency characteristics heretofore unobtainable in this type of circuitry. A novel low-pass thermal filter device has also been described which passes only very low frequencies.

The integrated circuits described above could be of the form wherein combinations of epitaxial deposition and diffusion techniques are used to make the devices, including the structures wherein separated monocrystalline semiconductor regions are defined in the surface of a polycrystalline semiconductor substrate but are insulated therefrom by a dielectric.

Although a preferred embodiment of the invention has been described in detail, it is to be understood that various changes, substitutions and alterations can be made therein without departing from the spirit and scope of the invention as defined by the appended claims.

What is clamed is:

1. A wide-band amplifier system comprising:
a direct-coupled amplifier having an input and an output, and
negative feedback circuit means connected between the input and output for suppressing the low frequency gain of the amplifier, said negative feedback circuit means including a thermally-coupled low-pass thermal-filter means.

2. A wide-band amplifier system as defined in claim 1 wherein the low-pass thermal filter means comprises:
thermal capacitance means,
ambient heat sink means,
thermal insulation means disposed between the thermal capacitance means and the heat sink means for thermally insulating the thermal capacitance means from the ambient heat sink means,
heater means disposed in the thermal capacitance means for heating the thermal capacitance means in proportion to the output of the direct-coupled amplifier, and
sensing means disposed in the thermal capacitance means and adjacent the heater means for sensing the temperature of the thermal capacitance means and varying the input to the direct-coupled amplifier in proportion to the temperature whereby only the low-frequencies of the output, as determined by the thermal capacitance means and the thermal insulation means, will be fed back to the input.

3. A wide-band amplifier system as defined in claim 2 wherein the negative feedback circuit means includes:
inverter phase amplifier means connected between the output of the direct-coupled amplifier and the low-pass thermal filter means for producing a negative feedback.

4. A wide-band amplifier system as defined in claim 2 wherein the heater means comprises:
a resistance disposed in heat-exchange relationship with the thermal capacitance means and means for varying the current through the resistance in relation to the output voltage of the amplifier.

5. A wide-band amplifier system as defined in claim 2 wherein the sensing means comprises:
a diode junction in heat-exchange relationship with the thermal capacitance means and circuit means for summing the voltage across the diode junction and the input voltage to the amplifier.

6. A wide-band amplifier system as defined in claim 2 wherein the heater means comprises:

a collector voltage supply terminal for connection to a voltage supply, a transistor, the collector of which is connected to the voltage supply terminal and the base of which is connected to the output of the direct-coupled amplifier, and a resistor interconnecting the emitter of the transistor and ground.

7. A wide-band amplifier system as defined in claim 2 wherein the sensing means is comprised of:

a collector voltage supply terminal for connection to a collector voltage supply, an emitter voltage supply terminal for connection to an emitter voltage supply, a transistor, the collector of which is connected to the collector voltage supply terminal, the emitter of which is connected to the input of the direct-coupled amplifier and to the emitter voltage supply terminal through a resistor, and the base of which is connected to the input terminal for the amplifier system, whereby the input voltage to the base of the transistor will be summed with the base emitter voltage of the transistor.

8. A wide-band amplifier system as defined in claim 7 wherein:

the emitter of the transistor is connected to the input of the direct-coupled amplifier and to the emitter voltage supply terminal by at least one diode junction.

9. A wide-band amplifier system comprising:

a direct-coupled amplifier having an input and an output, thermal capacitance means comprising a body of monocrystalline semiconductor material, ambient heat sink means, thermal insulation means disposed between the thermal capacitance means and the ambient heat sink means for thermally insulating the thermal capacitance means from the ambient heat sink means, heater means disposed in the thermal capacitance means for heating the thermal capacitance means in proportion to the output voltage of the amplifier comprising a circuit including a transistor connected to a resistor both lying within the thermal capacitance means, the emitter of the transistor being connected to the resistor, the output voltage of the direct-coupled amplifier being applied to the base of the transistor to control the current through the heating circuit, and sensing means disposed in the thermal capacitance means and adjacent the heater means for sensing the temperature of the thermal capacitance means comprising a transistor lying within the thermal capacitance means, the collector of which is connected to a collector supply voltage, the emitter of which is connected to the input of the amplifier, and the direct-coupled base of which is connected to the input of the amplifier system.

10. A wide-band amplifier system as defined in claim 9 wherein:

the direct-coupled amplifier is formed in a single monocrystalline semiconductor body.

11. A wide-band amplifier system comprising:

a direct-coupled differential amplifier having first and second inputs and corresponding first and second outputs, and first and second negative feedback circuit means each including a thermally-coupled low-pass thermal filter means, the first feedback circuit means connecting the first output to one of the inputs and the second feedback circuit means connecting the second output to the other of the inputs.

12. A wide-band amplifier system as defined in claim 11 wherein each of the low-pass thermal filter means comprises:

thermal capacitance means, ambient heat sink means, thermal insulation means disposed between the thermal capacitance means and the ambient heat sink means for thermally insulating the thermal capacitance means from the ambient heat sink means, heater means disposed in the thermal capacitance means for heating the thermal capacitance means in relation to the output of the direct-coupled differential amplifier, and sensing means disposed in the thermal capacitance means and adjacent the heater means for sensing the temperature of the thermal capacitance means and varying the respective inputs to the direct-coupled differential amplifier in proportion to the temperature sensed, whereby only the low frequencies of each output, as determined by the thermal capacitance means and the thermal insulation means, will be fed back to the respective inputs.

13. A wide-band amplifier system as defined in claim 12 wherein each of the negative feedback circuit means includes:

phase inverter amplifier means connected between the output of the direct-coupled differential amplifier and the low-pass thermal filter means for producing a negative feedback.

14. A wide-band amplifier system as defined in claim 12 wherein the heater means comprises:

a resistance disposed in heat-exchange relationship with the thermal capacitance means, and means for varying the current through the resistance in relation to the output voltage of the direct-coupled differential amplifier.

15. A wide-band amplifier system as defined in claim 12 wherein the heater means comprises:

a diode junction in heat exchange relationship with the thermal capacitance means, and circuit means for summing the voltage across the diode junction and the input voltage to the direct-coupled differential amplifier.

16. A wide-band amplifier system as defined in claim 12 wherein each of the heater means comprises:

a collector voltage supply terminal for connection to a voltage supply, a transistor, the collector of which is connected to the voltage supply terminal and the base of which is connected to the respective output of the direct-coupled differential amplifier, and a resistor interconnecting the emitter of the transistor and ground.

17. A wide-band amplifier system as defined in claim 12 wherein each of the sensing means is comprised of:

a collector voltage supply terminal for connection to a collector voltage supply, an emitter voltage supply terminal for connection to an emitter voltage supply, a transistor, the collector of which is connected to the collector voltage supply terminal, the emitter of which is connected to the input of the direct-coupled differential amplifier and to the emitter voltage supply terminal through a resistor, and the base of which is connected to the input terminal for the amplifier system, whereby the input voltage to the base of the transistor will be summed with the base-to-emitter voltage of the transistor.

18. A wide-band amplifier system as defined in claim 17 wherein:

the emitter of the transistor is connected to the input of the direct-coupled differential amplifier and to the emitter voltage supply terminal by at least one diode junction.

19. A wide-band amplifier system comprising:

a direct-coupled differential amplifier having first and second inputs and corresponding first and second outputs, first negative feedback circuit means connecting the first output to the first input and second negative feedback means connecting the second output to the second input, each of said feedback circuit means comprising a phase inverter amplifier and a low-pass thermal filter means.

20. A wide-band amplifier system as defined in claim 19 wherein each of the low-pass thermal filter means is comprised of:

thermal capacitance means comprising a body of monocrystalline semiconductor material, ambient heat sink means, thermal insulation means disposed between the thermal capacitance means and the ambient heat sink means for thermally insulating the thermal capacitance means from the ambient heat sink means, heater means disposed in the thermal capacitance means for heating the thermal capacitance means in proportion to the output voltage of the direct-coupled differential amplifier comprising a circuit including a transistor connected to a resistor, both lying within the thermal capacitance means, the output voltage of the direct-coupled differential amplifier being applied to the base of the transistor to control the current through the circuit, and sensing means disposed in the thermal capacitance means and adjacent the heater mean for sensing the temperature of the thermal capacitance means comprising a transistor lying within the thermal capacitance means, the collector of which is connected to a collector supply voltage, the emitter of which is connected to the input of the direct-coupled differential amplifier, and the base of which is connected to the input of the amplifier system.

21. A wide-band amplifier system as defined in claim 20 wherein:

the direct-coupled differential amplifier is comprised of semiconductor regions in a single monocrystalline semiconductor member.

22. A low-pass thermal filter device comprising:

thermal capacitance means, ambient heat sink means, thermal insulation means disposed between the thermal capacitance means and the ambient heat sink means for thermally insulating the thermal capacitance means from the ambient heat sink means, heater means disposed in the thermal capacitance means for heating the thermal capacitance means in proportion to an input signal, and sensing means disposed in the thermal capacitance means and adjacent the heater means for sensing the temperature of the thermal capacitance means and producing an output signal proportional to the temperature, whereby only the low-frequency content of an input signal, as determined by the thermal capacitance means and the thermal insulation means, will be passed through the device.

23. A low-pass thermal filter device as defined in claim 22 wherein the heater means comprises:

a resistance disposed in heat-exchange relationship with the thermal capacitance means and means for varying the current through the resistance in relation to the input signal.

24. A low-pass thermal filter device as defined in claim 22 wherein the sensing means comprises:

a diode junction in heat-exchange relationship with the thermal capacitance means and circuit means for producing an output signal varying in proportion to the voltage across the diode junction.

25. A low-pass thermal filter device as defined in claim 22 wherein the heater means comprises:

a collector voltage supply terminal for connection to a voltage supply, a transistor, the collector of which is connected to the voltage supply terminal and the base of which is connected to the input terminal to the filter device, and a resistor interconnecting the emitter of the transistor and ground.

26. A low-pass thermal filter device comprising:

a thermal capacitance means comprising a body of monocrystalline semiconductor material, ambient heat sink means, insulation means disposed between the thermal capacitance means and the ambient heat sink means for insulating the capacitance means from the ambient heat sink means, heater circuit means disposed in the thermal capacitance means for heating the thermal capacitance means including a resistor and a transistor for controlling the current through the heater circuit means in relation to an input signal, the emitter of the transistor being connected to the resistor, sensing circuit means disposed in the thermal capacitance means and adjacent the heater circuit means for sensing the temperature of the capacitance means including a diode junction formed by diffused regions in the capacitance means, and circuit means for producing an output signal in proportion to the temperature of the diode junction.

27. A low-pass thermal filter device as defined in claim 26 wherein said sensing circuit comprises:

circuit means disposed in the thermal capacitance means and adjacent the heater circuit means comprising a transistor within the thermal capacitance means, a collector supply voltage terminal connected to the collector of the transistor, an emitter supply voltage connected to the emitter of the transistor through a resistor, an input terminal connected to the base of the transistor, and an output terminal connected to the emitter of the transistor, whereby an input voltage signal applied to the input terminal will be summed with a voltage signal proportional to the temperature of the base emitter junction of the transistor to produce an output signal.

References Cited

UNITED STATES PATENTS

| | | | |
|---|---|---|---|
| 2,648,823 | 8/1953 | Kock et al. | 317—248 |
| 3,105,942 | 9/1963 | Hermes | 330—86 |
| 3,188,576 | 6/1965 | Lewis | 330—31 |

ROY LAKE, *Primary Examiner.*

E. C. FOLSOM, *Examiner.*